(12) United States Patent
Doyle

(10) Patent No.: US 6,850,058 B2
(45) Date of Patent: Feb. 1, 2005

(54) OFFSET AND LOW FREQUENCY NOISE INSENSITIVE MAGNETIC SENSOR

(75) Inventor: John Doyle, Cork (IE)

(73) Assignee: University College Cork-National University of Ireland, Cork (IE)

(*) Notice: Subject to any disclaimer, the term of this patent is extended or adjusted under 35 U.S.C. 154(b) by 0 days.

(21) Appl. No.: 10/139,913

(22) Filed: May 6, 2002

(65) Prior Publication Data

US 2003/0206011 A1 Nov. 6, 2003

(51) Int. Cl.[7] .................. G01R 33/02; G01R 33/06; H01L 27/22
(52) U.S. Cl. ................................ 324/252; 327/510
(58) Field of Search ................ 324/252; 338/32 R; 327/365–510; 257/421, 422, 252, 222

(56) References Cited

U.S. PATENT DOCUMENTS 4,681,440 A * 7/1987 Burke et al. ............... 356/218
5,760,581 A * 6/1998 Kalb, Jr. .................... 324/252
5,801,533 A 9/1998 Kalb, Jr. .................... 324/252

OTHER PUBLICATIONS

Baltes, Henry P. *Integrated Semiconductor Magnetic Field Sensors*, Proceedings of The IEEE, vol. 74, No. 8, p. 1107–1131, 1986.

* cited by examiner

*Primary Examiner*—Jay Patidar
*Assistant Examiner*—Reena Aurora
(74) *Attorney, Agent, or Firm*—Greer, Burns & Crain, Ltd.

(57) ABSTRACT

The invention provides an offset and low frequency noise insensitive magnetic sensor which incorporates a magnetic field effect transistors (MagFETs). Methods of improving the signal to noise ratio and reducing errors from offsets when measuring magnetic fields using MagFETs are also described. The invention also provides for the use of such methods and sensor in circuitry adapted to provide for residual current detection.

11 Claims, 11 Drawing Sheets

OFFSET AND LOW FREQUENCY NOISE INSENSITIVE MAGNETIC SENSOR

FIELD OF THE INVENTION

The present invention relates generally to magnetic field sensors. More specifically, the present invention relates to magnetic field effect transistors (MagFETs) and methods of improving the signal to noise ratio and reducing errors from offsets when measuring magnetic fields using MagFETs.

BACKGROUND OF THE INVENTION

Magnetic sensors are widely used in a variety of industrial fields, e.g. position sensing and also including for example, medicine. Magnetic sensors typically convert a magnetic flux into an electrical signal, either in the forms of a differential voltage or a differential current. Typical magnetic field sensors available, include hall effect devices and magnetic field effect transistors (MagFETs). A significant advantage of MagFETs over Hall effect devices is that they can be formed as a part of a standard integrated circuit, for example using CMOS processes. Hall effect devices are typically manufactured as discrete devices.

FIG. 1 is an illustration of a typical dual drain MagFET 10, consisting of a source 11, gate 14, and two drains D1 12 and D2 13. In operation, a suitable bias voltage 15, is applied to the gate 14, and a second biasing arrangement causes a current (I) to flow between the source 11, and the two drains 12, 13. Assuming ideal devices and in the absence of a magnetic flux, the currents flowing through the first drain (D1) 12, and second drain (D2) 13, would be equal. When a magnetic field is present a Lorentz force is exerted upon the moving charge carriers in the MagFET. The direction of exertion of the force is determined by reference to the well known right hand rule. In the device shown in FIG. 1, a magnetic field flowing transverse to the page from top to bottom would result in a force acting upon the charge carriers in the MagFET such that the current is diverted in a clockwise direction. Whereas a magnetic field flowing in the opposite direction would result in a force acting in an anticlockwise direction. Such a force will have the effect of deflecting the path of charge carriers from one drain to the other. This deflection causes a differential between the currents of the first drain and second drain. This differential current may be amplified to produce an indication or measurement of the magnetic field.

When operating MagFETs at low currents (100 nA level) offset and noise become very significant. For example, if a device having an aspect ratio of one is operated at 100 nA, it has an enhancement voltage of only about 100 mV. The differential introduced in such a device by (for example) a 10 Gauss magnetic field may only be about 20 ppm. The voltage excursion on the gate required to produce a similar change in current is only of the order of a microvolt or less. Given that noise and offsets at the gate may be of the order of tens of millivolts, the signal arising from the magnetic field is not easy to detect. The effects of offset may be alleviated using calibration, as the offset tends to stay constant for a reasonable amount of time. However, the offset changes with temperature which necessitates the use of special temperature compensating circuitry to ensure that any change in temperature does not require re-calibration.

The technique of chopping is frequently used to reduce errors arising from noise and offset errors in measuring circuits. Unfortunately, standard chopping techniques cannot be used with MagFETs as the technique of chopping depends on the devices that make up the inputs being completely interchangeable, which is not the case for MagFETs. In a MagFET the magnetic flux will create different offsets depending on the relative orientation of the MagFET, i.e. the flux effectively identifies which is the right hand and which is the left hand gate. In other words, the magnetic field and its effects are vector quantities and it is the orientation of the MagFET to the magnetic field which defines the inputs. In order to chop the inputs of a MagFET, the physical orientation of the MagFET with respect to the magnetic field would have to change, at a rate in excess of the rate of change of the Magnetic Field. It will be appreciated by those skilled in the art that this is not a practicable solution.

U.S. Pat. No. 5,801,533 describes a typical circuit arrangement for implementing a dual drain MagFET magnetic field measurement device circuit. As explained above, this circuit cannot use conventional prior art chopping techniques.

An alternative MagFET device to the dual drain MagFET is the triple drain MagFET, an example of which is shown in FIG. 2. The triple drain MagFET comprises a gate 22, a source 20, a central drain 24 and two side drains 23,25 disposed at either side of the central drain 24. The central drain 24 is larger than the two side drains 23,25. This device operates in a similar fashion to the dual drain version, except the differential current is measured between the two side drains 23,25. In use, the majority of the current 28 flows through the central drain D2, with only a small portion 27,29 flowing in the two side drains (D1 and D3). In the presence of a magnetic field flowing transverse to the surface of the MagFET, the current flowing 27,29 in one side drain 23,25 will increase and the current flowing 29,27 in the other side drain 25,23 will decrease. The current 28 in the main drain 24 will remain substantially the same. A measurement of the differential current (27–29) between the two side drains may used to produce an indication or measurement of the magnetic field.

It will be appreciated that the relative change in measured current from a triple drain MagFET is typically greater than for dual drain MagFETs. Although the triple drain MagFET typically has superior signal to noise characteristics to dual drain MagFETs, it still suffers to a large extent from the problems described above of noise and offset.

Baltes H. P. and Popovic R. S., "Integrated Semiconductor Magnetic Field Sensors", Proceedings of the IEEE, Vol. 74, No. 8 August 1986, discloses a Hall effect plate having a plurality of contacts, wherein, performance is improved by the combination of Hall and magneto-resistance effects. The problem with this device is that chopping techniques cannot be used and the Hall effect plate cannot be constructed on an integrated circuit as easily as a MagFET.

As described above, in a MagFET, a magnetic field will induce a differential signal corresponding to an indication of the magnetic strength of a field it is placed in that will look exactly the same as one introduced by a device mismatch induced offset. Accordingly, prior art chopping techniques, which reduce standard offset and noise, will similarly reduce the magnetically induced offset.

It would be advantageous therefore if it were possible to distinguish magnetically induced offsets from mismatch and noise induced offsets and to produce a circuit that can detect magnetic fields below the nominal noise floor of the sensing device. In particular, it would be advantageous if a circuit could be provided which reduces the effects of low frequency noise in magnetic field measurement circuits using a MagFET as the sensor.

SUMMARY OF THE INVENTION

Prior art MagFETs are limited in their application because of problems introduced into measurements by noise and offsets, the present invention is directed at overcoming these problems by providing a MagFET in which differential measurements of current are taken from a plurality of paired drains rather than a single pair of drains.

In a first embodiment of the present invention, a MagFET is provided comprising a gate, a source, a first set of at least three drains wherein each of the drains of the first set have equivalent electrical characteristics. Preferably, the differential characteristics between adjacent drains of the first set are equivalent and/or the distance between adjacent drains of the first set are similar.

In a preferred embodiment, the drains of the first set are arranged uniformly around the source, preferably in the drains of the first set are arranged in a substantially circular formation.

The drains of the first set are arranged in pairs for measurement purposes, and the MagFET comprises at least two pairs.

In an optional embodiment, the MagFET further comprises a second set of drains, in which at least one drain of the second set is disposed between adjacent drains of the first set.

In this optional embodiment, each of the drains of the second set is larger than the drains in the first set. Preferably, in use the MagFET is intended to have a lower current flowing in the first set of drains than the second set of drains.

The invention also provides a method of measuring a magnetic field using a MagFET comprising a gate, a source and a plurality of paired drains comprising the steps of suitably biasing the MagFET, measuring the differential current between the drains of each pairing of drains, combining the measured differential currents to produce a signal indicative of the strength of the magnetic field. Preferably, the step of combining the measured differential currents is performed as an averaging or integrating function.

The invention further provides a measuring circuit comprising a MagFET having a source, gate and at least three drains a biasing circuit for suitably biasing the MagFET, an integrator having a first input and second input for integrating the difference between the first input and the second input, a switching circuit for selectively connecting the first drain and second drain of at least one pair of adjacent drains of the MagFET to the first input and second input of the integrator respectively in response to a command signal, a control circuit for generating the command signal such that each adjacent pair of drains of the MagFET is selected in a pre-defined time period.

Preferably, the measuring circuit further comprises a current mirror comprising a first and second transistor, wherein the drain of the first transistor is connected to a first input of the integrator and the drain of the second transistor is connected to a second input of the integrator. Optionally, the measuring circuit further comprises a switching arrangement disposed between the transistors of the current mirror and the integrator for switching the drain of the first transistor between the first input of the integrator and the second input of the integrator and switching the drain of the second transistor between the second input of the integrator and the first input of the integrator.

The invention additionally provides a residual current detector or earth leakage circuit breaker.

These and other features of the present invention will be better understood with reference to the following drawings.

DETAILED DESCRIPTION OF THE DRAWINGS

Figure 1:
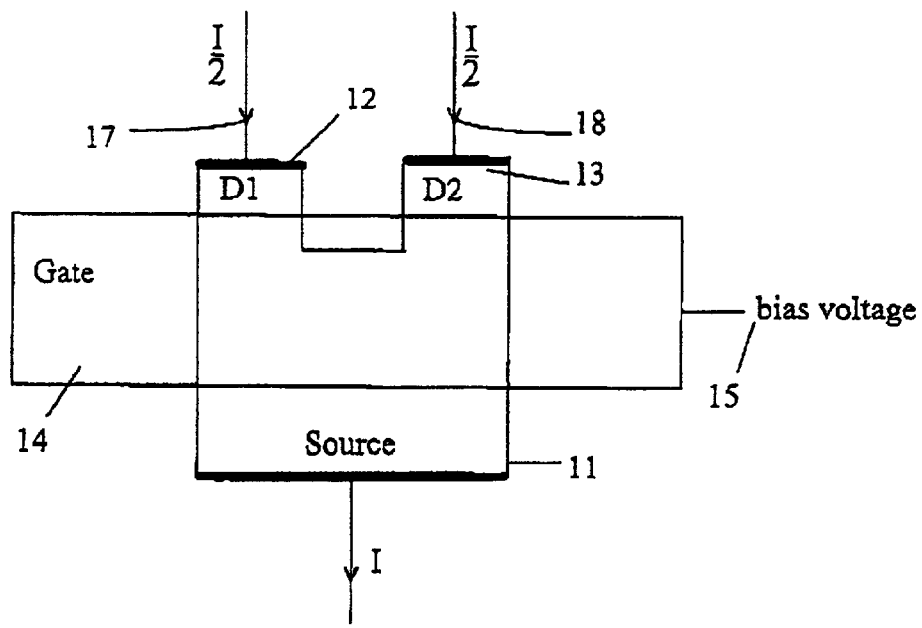
FIG. 1 is a Prior Art dual drain MagFET.
Figure 2:
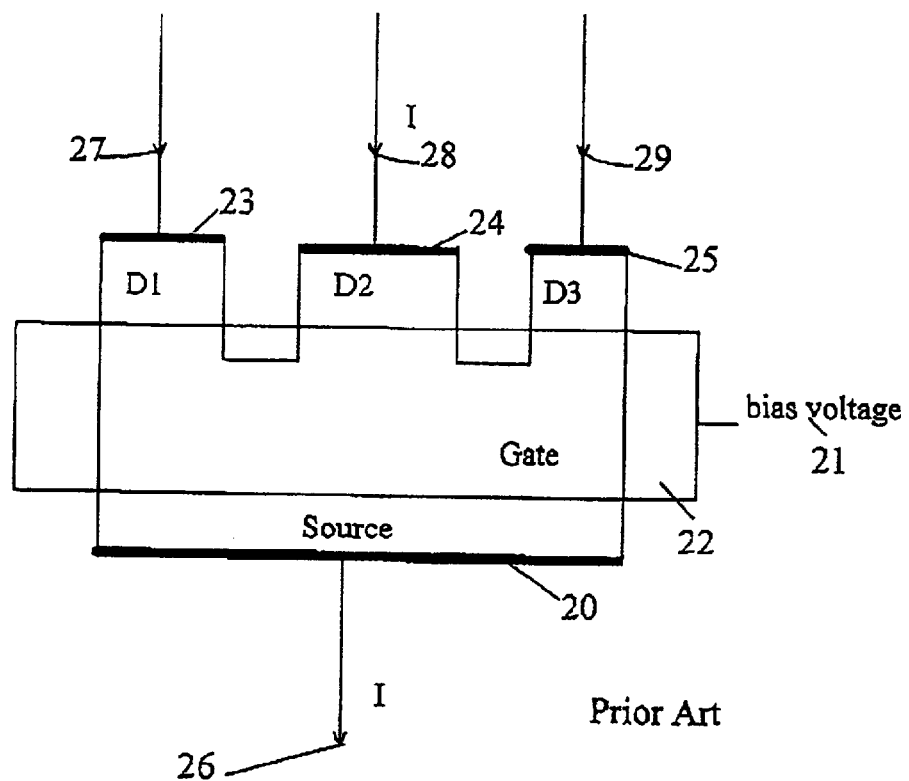
FIG. 2 is a Prior Art triple drain MagFET.
Figure 3:
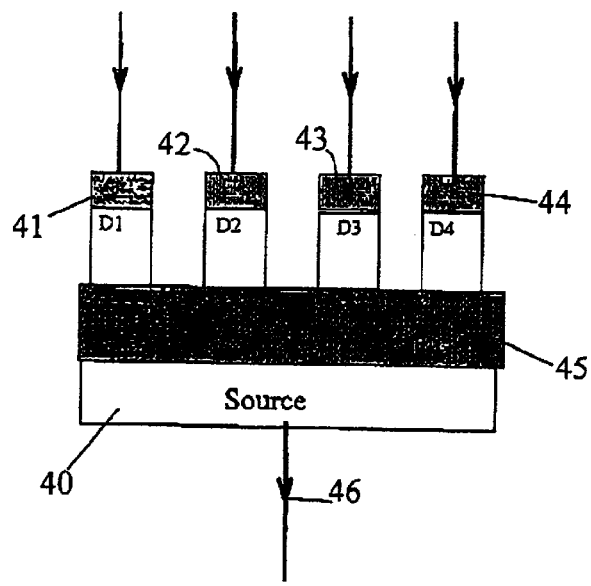
FIG. 3 is a quad drain MagFET according to the present invention.

An exemplary MagFET according to the invention is shown in FIG. 3. The MagFET comprises a source 40, gate 45 and four drains 41, 42, 43, 44. The four drains 41, 42, 43, 44 are arranged in three pairings of adjacent drains; D1,D2; D2,D3; D3,D4 (41,42; 42,43; 43,44). Each of the drains 41, 42, 43, 44 is preferably designed to have substantially matching characteristics with respect to the other drains 41, 42, 43, 44. It should be appreciated that an intention of the invention is to reduce the effects of mis-matching characteristics, and so a significant deviation in characteristics can be overcome using the present invention compared with prior art techniques.

Each pair of adjacent drains (41,42; 42,43; 43,44) preferably has substantially matching differential characteristics with respect to the other pairs of adjacent drains (41,42; 42,43; 43,44). One of skill in the art will recognise that differences in characteristics are nonetheless inevitable. For example, the noise and offset characteristics of each pair of adjacent drains will vary.

The MagFET of the present invention differs significantly from the prior art dual drain or triple drain MagFETs in that it provides more than one pair of drains which may be used for measuring magnetic fields.

Figure 4:
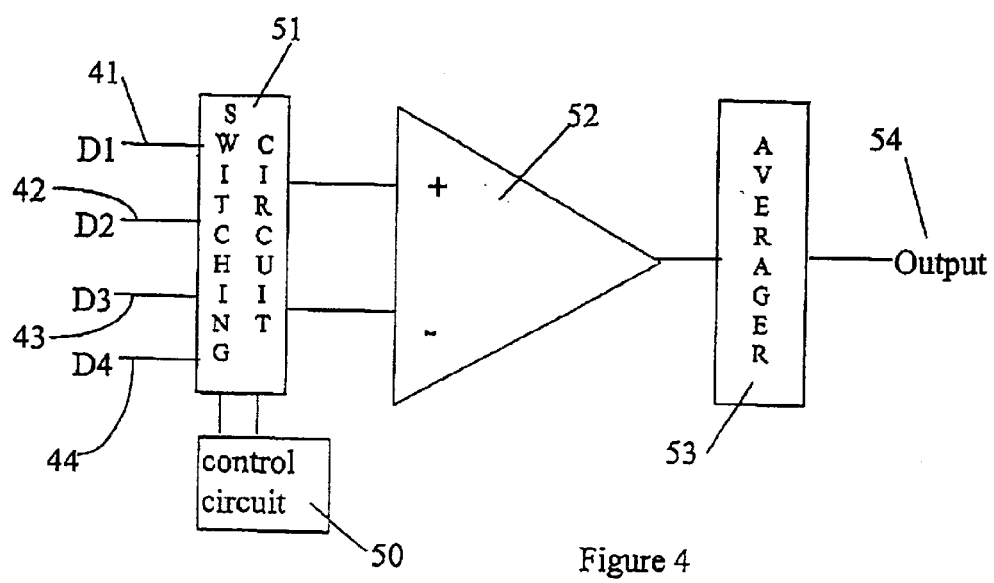
FIG. 4 is a block diagram of a measuring circuit for use with the MagFET of FIG. 3.

In use, for example as shown in the conceptual block diagram of FIG. 4, suitable biasing signals are applied to the gate and source of the MagFET, and an appropriate measuring circuit 52 is connected to the drains (41, 42, 43, 44). The measuring circuit 52 is suitably designed to produce an output signal representative of the differential current of a pair of adjacent drains (41,42; 42,43; 43,44). The design of measuring circuits to perform this type of measurement are well known in the art.

A switching means 51, e.g. a FET switching circuit, disposed between the drains and measuring circuit, is provided to connect the measuring circuit 52 to the drains 41, 42, 43, 44 of the MagFET.

The switching circuit 51 is adapted to connect pairs of adjacent drains of the MagFET to the measuring circuit 52 in response to control signals from a control circuit 50. The control circuit 50 generates suitable control signals so as to alternate the pairings of drains that are connected to the measuring circuit at any one time.

In a preferred embodiment, the frequency of selection of each pairing of drains should be the same. To achieve this the pairings of drains may, for example, be selected in a sequential or pseudo-random fashion.

The rate at which pairings are switched should be greater than the maximum rate of change of the magnetic field to be measured. The averaging circuit (or integrator) 53 e.g. a low pass filter, removes transients due to switching and averages the differences between measurements from the drains so as to produce an output signal 54 indicative of the magnetic field.

The advantage of the MagFET and measuring technique will now be described with reference to an exemplary selection cycle. The cycle commences with the control circuit 50 issuing a control signal to the switching circuit 51 to connect the pairing of drains ($D_1$, $D_2$) 41,42 to the measuring circuit 52. The measuring circuit in turn produces an output sign representative of the difference in current flowing between $D_1$ and $D_2$, i.e. $I_{D1}$–$I_{D2}$. This output signal contains errors arising from noise and offset of both Mag-FETs. Additional errors will arise from offsets and noise between the inputs of the measuring circuit. The output signal from the measuring circuit 52 is provided as an input to the averaging circuit 53. After a suitable switching period, the control circuit 50 issues a control signal to the switching circuit 51 to disconnect the first pair of drains ($D_1$, $D_2$) 41,42 from the measuring circuit 52 and to connect the second pair of drains ($D_2$, $D_3$) 42,43 to the measuring circuit 52. At this point, the measuring circuit 52 produces a signal corresponding to the differential current of the second pair of drains, i.e. $I_{D2}$–$I_{D3}$. This signal from the measuring circuit 52 is provided as an input to the averaging circuit 53. At the end of the second switching period, the output from the averaging circuit corresponds to the combined values of the differential currents of the first pair of drains $I_{D1D2}$ and the second pair of drains $I_{D2D3}$.

To simplify the description, any reference to reduction in errors due to offset may also be taken to imply an improvement in low frequency noise performance, i.e. improved signal to noise ratio. In the case of the differential current of the first pair of drains ($D_1$, $D_2$) 41,42, the offset and low frequency noise arising from the second drain $D_2$ 42 has a subtractive effect on the output of the measured signal from the measuring circuit 52. In the case of the second differential current $I_{D2I_{D3}}$, the offset and low frequency noise arising from drain $D_2$ 42 has an additive effect on the measured signal output from the measuring circuit. The magnetic signal has an additive effect in both cases as it switches with the switching action because of the right hand rule described above and as a result is not cancelled. For example if a magnetic field causes a increased current in $D_2$ in the case of the first pair, it will cause an increased current in $D_3$ in the case of the second pair. As the signals arising from the magnetic field will remain constant they will be accumulated by the averaging circuit (53). Accordingly, when the two measured signals are combined in the averaging circuit, the errors arising from offset in the second drain are cancelled. In addition, the effects of noise are also reduced by the technique. Moreover, the signal due to the presence of a magnetic field is unaffected by the switching action. Similarly when the measured signal for the third pairing of drains $D_3$–$D_4$ is combined with the first two pairings of drains, the offset error arising from the third drain $D_3$ is eliminated. As a result, when the differential currents of each pair are combined together, errors arising from offsets are only present for the first drain $D_1$ and the last drain $D_4$. Since these errors are only present for a third of the time in respect of the total switching period for measuring all three pairings or drains, the errors due to offsets in the drains of the MagFET are reduced by approximately 66%. Using a MagFET having three drains, which in effect creates two pairs of paired drains, the reduction in error would be approximately 50%, whereas using an eight drain configuration the error would theoretically be reduced by approximately 87%. The measured signal due to the presence of a magnetic field is unaffected by the switching of the drains.

Figure 5:
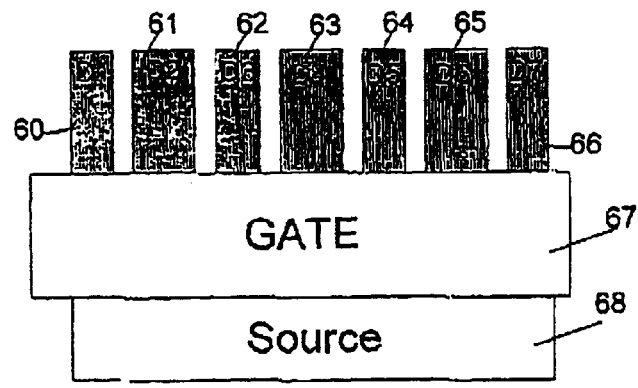
FIG. 5 is a block diagram of a triple drain version of the MagFET of FIG. 3.

A triple drain type device using paired drains is shown in FIG. 5, comprising seven drains 60,61,62,63,64,65,66, a source 68, and a gate 67. In this arrangement, there are three pairs of adjacent drains for measurement purposes D1,D3; D3,D5; D5,D7 (60,62; 62,64; 64,66). Interspersed between the pairs of adjacent drains are current carrying drains D2; D4; D6 (61,63, 65).

In use, the triple drain embodiment would require a switching circuit which would connect the paired drains to the measuring circuit and would also connect the respective current drain for each pair as the pair is connected to the measuring circuit. For example, when the first pair D1, D3 of drains are connected to the measuring circuit, the second drain D2 would also be connected, whereas the remaining drains are disconnected. As with the first embodiment described above it will be appreciated that errors arising from offsets in the measuring drains will be reduced. The triple drain version of the device may be further modified such that the main current carrying drain comprises two or more drains. In this modified structure, two drains may be used, for example, to produce a signal indicative of the magnetic field direction.

However, as with the first embodiment, the errors arising from the offsets of the first and last drains of the triple drain embodiment cannot be eliminated using the described technique.

Figure 6:
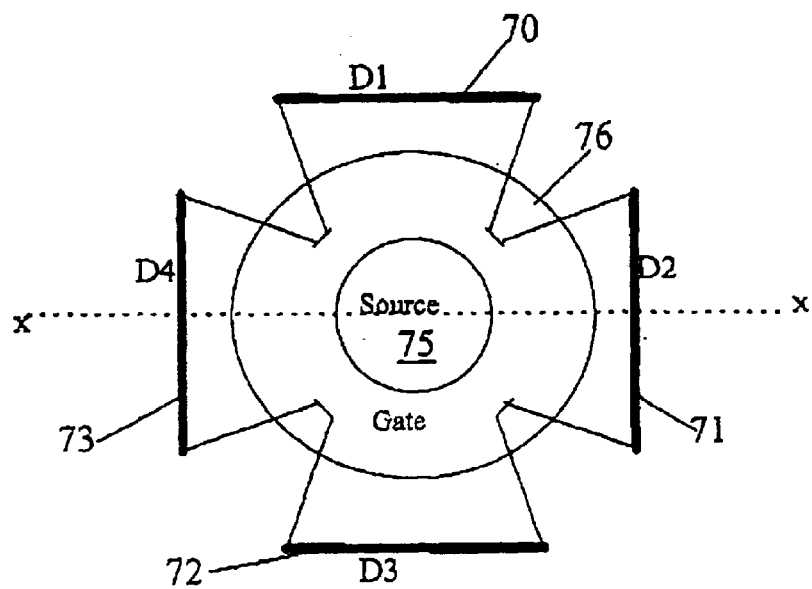
FIG. 6 is a simplified diagram of a MagFET according to the present invention.

A further embodiment which effectively eliminates the errors arising from all of the drains in a MagFET is shown in FIG. 6, comprising a source 75, gate 76 and four drains 70, 71, 72, 73. The four drains 70, 71, 72, 73 are arranged about the source 75 in a substantially circular arrangement or formation. In this further embodiment, their are four pairings of drains (compared with three in the embodiments of FIGS. 3 and 5) D1,D2; D2,D3; D3,D4; and D4,D1 (70,71; 71,72; 72,73; 73,70). It will be apparent that using this embodiment, the errors arising from the offsets of D1 and D4 will be effectively eliminated, which was not possible using the previous embodiments.

Figure 7:
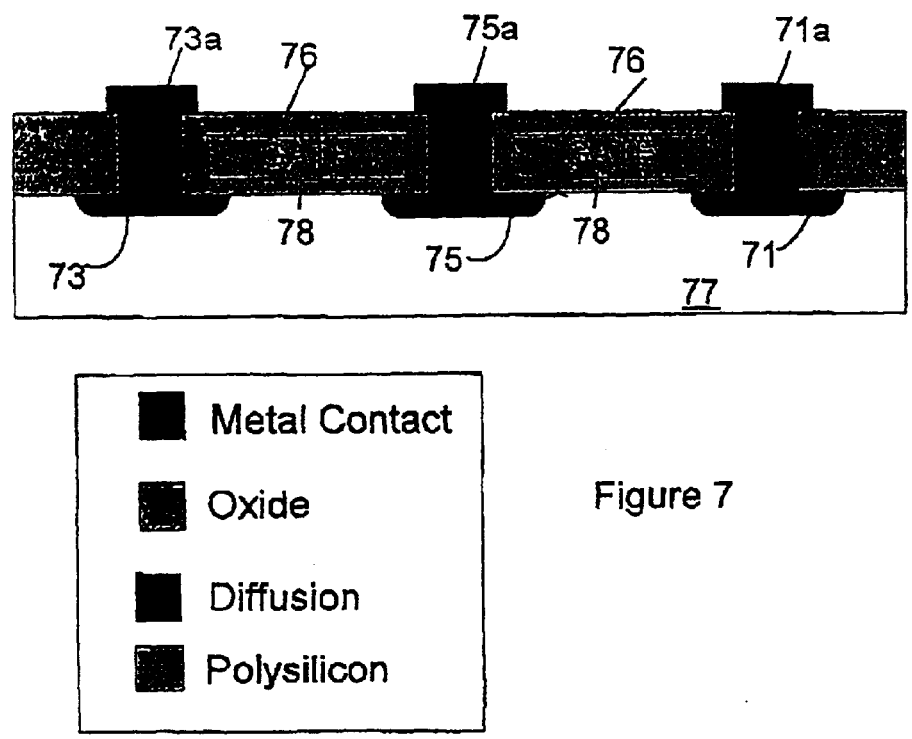
FIG. 7 is a cross sectional view of a MagFET according to the present invention.

The embodiments described above and shown in FIGS. 3 to 6 are simplified versions of MagFETs and their associated circuitry. The MagFETs of the present invention may be constructed using conventional semiconductor processes to establish diffusions and oxide layers so as to form a MagFET. An exemplary cross sectional view of the structure for the device of FIG. 6 (shown along section xx) is illustrated in FIG. 7. This figure represents a cross section through the second and fourth drains D2 71 and D4 73. It will be appreciated that the construction shown may be manufactured using conventional MOS manufacturing processes. The cross sectional view demonstrates that the drains (D2, D4) and source of the MagFET are formed as diffusions 73, 71, 75 in the silicon substrate 77 and covered by an oxide layer. The gate of the MagFET is formed as a region of polysilicon in the oxide layer 76 and extends from a region over the drain diffusions to a region over the source diffusions. Connections to the drains and source of the MagFET are provided by metal contacts 73a, 71a, 75a which form connections to the diffusions through the oxide layer. Although, the source and gate structures of the MagFETs are shown throughout this specification as being circular in nature, it will be appreciated by those skilled in the art that alternative structures may be used to obtain a similar effect, for example using a quasi circular structure made up of smaller rectangular sections.

Figure 8:
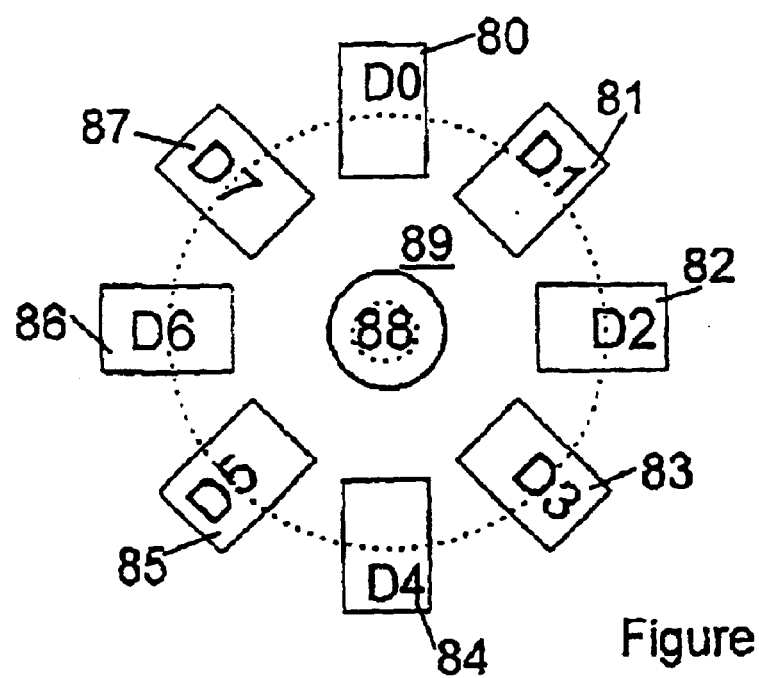
FIG. 8 is a further example of a MagFET according to the present invention.
Figure 9:
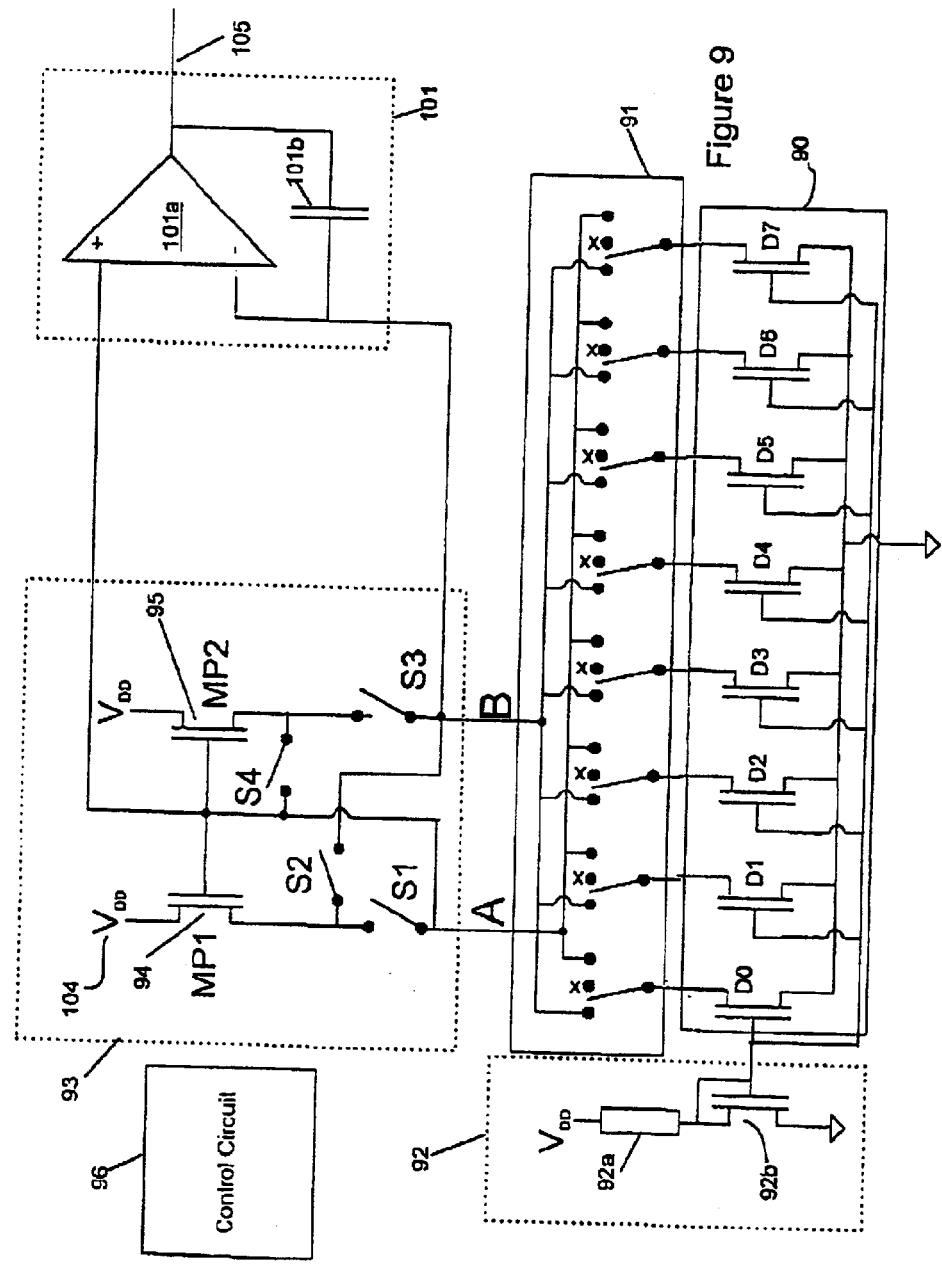
FIG. 9 is a circuit and schematic diagram of a MagFET and a measuring circuit according to the present invention.

An example circuit for obtaining a measurement of the strength of a magnetic field from an octal drain MagFET, shown in FIG. 8, is illustrated in FIG. 9. The octal drain MagFET, which is similar to the quad drain MagFET of FIG. 6, comprises eight drains D0–D7 80, 81, 82, 83, 84, 85, 86, 87 disposed about a centrally located source 88. The gate structure 89 overlaps the drains 80, 81, 82, 83, 84, 85, 86, 87 and source 88.

The exemplary circuit of FIG. 9 comprises the MagFET 90 of FIG. 8, a switching circuit 91, a measurement circuit 93, a combining circuit for combining the measurements of different MagFET drain pairs to produce an output signal 105, a control circuit 96 for generating control signals for the switching circuit and measurement circuit and a biasing circuit 92 comprising a FET resistor (92a–92b) arrangement for suitably biasing the MagFET 90.

The combining circuit 101 is implemented as a simple differential integrator comprising an amplifier 101a and capacitor 101b. The differential input signal to the integrator is applied directly to the non-inverting and inverting inputs of the amplifier.

The MagFET 90 is shown for illustrative purposes in FIG. 9 as eight separate FET devices, each FET device relating to one of the eight drains (D0, D1, D2, D3, D4, D5, D6, D7) 80, 81, 82 83, 84, 85, 86, 87 the gate 89 and source 88 being shared by each device. The gate 89 is suitably biased by the biasing circuit 92, comprising a FET-resistor arrangement to ensure a constant source current. The source of the MagFET is connected to ground.

The switching circuit 91 permits the individual connection of each drain 80, 81, 82 83, 84, 85, 86, 87 of the MagFET 90 to a first input (A) of the measurement circuit, a second input (B) of the measurement circuit 93 or open circuit (x).

The first input (A) of the measurement circuit 93 is connected to the non-inverting input of the integrator 101a and the second input (B) of the measurement circuit is connected to the inverting input of the integrator 101a.

The measurement circuit comprises a current mirror, formed from a first transistor (MP1) 94 and a second transistor (MP2) 95, and a switching arrangement comprising 4 switches (S1, S2, S3 and S4) for connecting the inputs of the measurement circuit (A, B) to the drains of the transistors of the current mirror. The gates of the two transistors 94, 95 of the current mirror are connected to the non inverting input of the integrator 101a and the first input (A) of the measurement circuit 93. The sources of the first and second transistor 94, 95 of the current mirror are connected to the supply voltage $V_{DD}$).

A first switch (S1) of the switching arrangement of the measuring circuit 93 is operable to connect the first input (A) of the measurement circuit 93 to the drain of the first transistor 94 of the current mirror of the measurement circuit.

A second switch (S2) of the switching arrangement of the measuring circuit 93 is operable to connect the second input (B) of the measurement circuit 93 to the drain of the first transistor 94 of the current mirror.

A third switch (S3) of the switching arrangement of the measuring circuit 93 is operable to connect he second input (B) of the measurement circuit 93 to the drain of the second transistor 95 of the current mirror.

A fourth switch (S4) of the switching arrangement of the measuring circuit 93 is operable to connect the first input (A) of the measurement circuit 93 to the drain of the second transistor 95 of the current mirror. In use, the third switch (S3) will be open when the first switch is open (S1) and closed when the first switch (S1) is closed. In use, the fourth switch (S4) will be open when the second switch (S2) is open and closed when S2 is closed. The relative operation of the first switch (S1) and second switch (S2) will be inverse i.e. when the fist switch (S1) is open, the second switch (S2) will be closed.

In a first mode of use, typically a first pair (D0,D1; D,D2; D2,D; D3,D; D4,D5; D5,D6; D6,D7; D7,D0) of adjacent drains of the MagFET (D0–D7) will be selected with the first drain of the pair of drains selected connected, via the first switch (S1) of the switching arrangement of the measurement circuit 93, to the drain of the first transistor MP1 94 of the current mirror of the measurement circuit, and the second drain of the selected pair of drains connected, via the third switch (S3)) of the switching arrangement of the measurement circuit 93, to the drain of the second transistor MP2 95 of the current mirror. The remaining six drains of the MagFET 90 will be switched open circuit (x).

Because of the nature of the current mirror arrangement, the current mirror attempts to maintain the same current flowing in the first transistor 94 of the current mirror as the second transistor 95 of the current mirror. Accordingly, any difference in current (e.g. as caused by the presence of a magnetic field) between the first input to the measuring circuit and the second input to the measuring circuit is fed directly to the differential inputs of the integrating circuit.

After a given time period, the next pairing of adjacent drains (D0,D1; D1,D2; D2,D3; D3,D4; D4,D5; D5,D6; D6,D7; D7,D0) of the MagFET will be selected followed by the next pair of drains, etc. At the end of the MagFET pair selection cycle, i.e. after all the pairings of drains have been selected, the integrator output will be representative of the combined differences in current between all of the pairings of drains. As the offset for each drain (D0–D7) will have been added during one time period and subtracted in another, the overall effect of the individual offsets of the drains will have cancelled. Accordingly, the output signal from the integrator should be representative of the magnetic field strength.

One source of error, that may be introduced is the difference in offset (and noise) between the first transistor of the current mirror and the second transistor of the current mirror of the measurement circuit. The switching arrangement of the measurement circuit may be used to significantly reduce this error.

To reduce the effects of error arising from the differences in offset in the transistors of the current mirror, the first input to the measurement circuit (A) is periodically (every MagFET pair selection cycle) switched between the drain of the first transistor (closing S1, opening S4) of the current mirror and the drain of the second transistor (closing S4, opening S1) of the current mirror. At the same time, the second input (B) to the measurement circuit 93 is switched between the drain of the second transistor (closing S3, opening S2) and the drain of the first transistor (closing S2, opening S3).

Using this technique, the offsets of the transistors of the current mirror will cancel every two MagFET selection pair cycles.

In a second mode of use, two or mote pairs of adjacent drains of the MagFET are connected simultaneously to the current mirror, with the first drain of each pair connected as the first input (A) to the measurement circuit and the second drain of each pair connected as the second input to the measurement circuit, with the unused drains of the MagFET 90 connected open circuit. Preferably, each two pairs of adjacent drains selected should be opposing pairings as it is believed that having devices (pairs) with a common centroid, the offset performance of the device may improve further.

Figure 10:
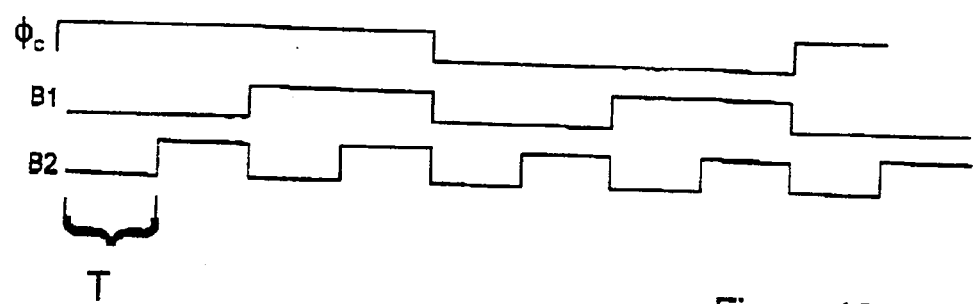
FIG. 10 is a timing diagram for the circuit of FIG. 8.

An example mode of operation of the second mode of use is now described with reference to the timing diagram of FIG. 10. The timing diagram identifies three timing signals ($\phi^c$, $B_1$ and $B_2$) which refer to the switching actions of the various switches in the circuit. The timing signals are generated by the Control Circuit 96. The first control signal $B_1$ and the second control signal $B_2$ control the switching actions of the switching circuit 91 connecting the individual drains of the MagFET to the inputs of the measurement circuit. The third control signal $\phi^c$ defines (controls) the switching action of the switches (S1, S2, S3 and S4) of the switching arrangement of the measurement circuit 93.

The operation of the switching circuit 91 connecting the individual drains (D0–D7) of the MagFET 90 to the measurement circuit 93, in response to the first and second control signals $B_1$ and $B_2$ is set out in Table 1. For example, Table 1 illustrates that when $B_1=0$ and $B_2=0$, the drain pairings of D0,D1 and D4,D5 of the MagFET are connected to the measurement circuit 93, with the drains D0 and D4 of the MagFET connected to the first input (A) of the measuring circuit 93 and drains D1 and D5 of the MagFET connected to the second input (B) of the measuring circuit 93. The remaining drains of the MagFET (D2, D3, D6 and D7) are connected open circuit (x).

In the present example, two pairs of opposing paired drains are connected to the measuring circuit at a time. It will be appreciated that if a single pairing of drains are connected at a time then a further timing signal will be required as the switching cycle will comprise eight different selections instead of four.

TABLE 1

|   | $B_1$ $B_2$ 0 0 | $B_1$ $B_2$ 0 : | $B_1$ $B_2$ 1 0 | $B_1$ $B_2$ 1 1 |
|---|---|---|---|---|
| A | D0, D4 | D1, D5 | D2, D6 | D3, D7 |
| B | D1, D5 | D2, D6 | D3, D7 | D4, D0 |
| Open Circuit | D2, D3, D6, D7 | D3, D4, D7, D0 | D4, D5, D0, D1 | D5, D6, D1, D2 |

A control circuit 96 is used to generate the control signals operating the switches of the circuit. It will be appreciated by those skilled in the art that the construction of a control circuit to produce the required control signals is extremely simple. For example, a simple clock signal could be used for the second control signal $B_2$ with the first control signal $B_1$ obtained by frequency dividing the second control signal $B_2$ by a factor of two. Similarly, the third control signal may be obtained by frequency dividing the first control signal B1 by a factor of two.

The switching operation of switches S1, S2, S3 and S4 are shown with respect to the timing signal $\phi^c$ in table 2.

TABLE 2

|    | $\phi^e$ 0 | $\phi^e$ 1 |
|----|---|---|
| S1 | closed | open |
| S2 | open | closed |
| S3 | closed | open |
| S4 | open | closed |

Initially, with the first control signal $B_1=0$ and the second control signal $B_2=0$, four of the drains (D2, D3 and D6, D7) of the MagFET are inactive (connected open circuit), two of the drains of the MagFET (D0, D4 ) are connected to the first input (A) of the measuring circuit 93 and two further drains Waited drains of the drains connected to the first input) of the MagFET (D1, D5) are connected to the second input of the measuring circuit(B). Accordingly, the output signal from the MagFET comprises the combined differential current of two separate pairs of drains D0–D1 and D4–D5.

As the third control signal $\phi^c=0$, S1 and S3 are closed with S2 and S4 open. This switching arrangement results in the first input to the measuring circuit (A) being connected to the drain of the first transistor (MP1) of the current mirror of the measurement circuit, with the second input to the measuring circuit (B) connected to the drain of the second transistor (MP2). As the MagFET is suitably biased, current flows in drains D0, D1, D4, D5 and with the aid of the current mirror the difference in drain currents is fed to the inputs of the integrator, resulting in an integrator output reflecting the combined differential currents for the pairing D0 and D1, and pairing D4 and D5.

Following a period of time (T), i.e. when $B_2$ changes state, drains D0 and D4 are switched to the inactive position, i.e. connected open circuit, and drains D1 and D5 are switched from the second input position B of the measurement circuit, to the first input position A, of the measurement circuit, and drains D2 and D6 are switched from the inactive position, i.e. open circuit, to the second input position B of the measurement circuit.

At the end of a second period of time (T), the output of the integrator reflects the previous output value of the integrator at the end of the first period, altered by an amount reflecting the integrated differential currents of the pairings D1 and D2, and D5 and D6 over the second period T. As the offsets of D1 and D5 were effectively subtracted for the first period and added in the second period, their overall effect should be cancelled by the averaging nature of the integrator. After two further periods of time (T), the effects of the offsets of all of the drains of the MagFET will have been reduced by the operation of the switching and measurement circuits.

At this point, the third control signal $\phi^c$ changes to 1, causing S1 and S3 to open and S2 and S4 to close. Thus the first input A to the measuring circuit 93 is now connected to the drain of the second transistor MP2 of the current mirror, whereas the second input B to the measuring circuit 93 is now connected to the drain of the first transistor MP1. After a further four periods of time (T), the output of the integrator should reflect a measurement of magnetic field in which the offsets arising from the transistors of the cement mirror have been cancelled.

Given that the transistors of the current mirror are being chopped at a much lower rate than that of the drains D0–D7, and so have a smaller portion of their 1/f noise removed, their transconductance should be minimised using normal techniques to reduce the current contribution of any such noise (given that it is the current that is being integrated to deliver an output). In this manner, A and B are cycled around all eight drains in succession, with MP1 and MP2 alternating roles every four clock cycles, to ensure every possible combination of drain and MP1, MP2 is exercised.

The first thing this technique does is to eliminate offsets arising from the MagFET, as the offset current induced by each drain is firstly subtracted from the integrator input, and in the next cycle added to same. In other words, if D1 has an offset that causes it to have a current that is 10% greater than the other drains, then his offset current is added given that D1 is now connected to node A of the summing junction during the first cycle. However, in the second cycle, given that D1 is now connected to node B, the offset current is subtracted from the summing node and so its effect is cancelled out. Therefore, offsets in the drains of the MagFET should cancel out. Secondly, if the cycling of the drains is at a sufficient rate (e.g. 1 kHz), the 1/f noise should be largely cancelled out by the same mechanism (It is believed that noise in a frequency band significantly lower than the clock rate should be eliminated). Given that thermal noise will be attenuated by the integrating nature of the system, this arrangement should give a good representation of the input signal (i.e. the magnetic flux), with only a narrow band of noise around the commutation frequency degrading the result.

The sensitivity of a MagFET can be greatly increased and the deleterious effects of low frequency noise considerably reduced by provision of a MagFET as described above and using the method described above in which the individual drains of the MagFET may be commutated in a cyclic manner.

Figure 12:
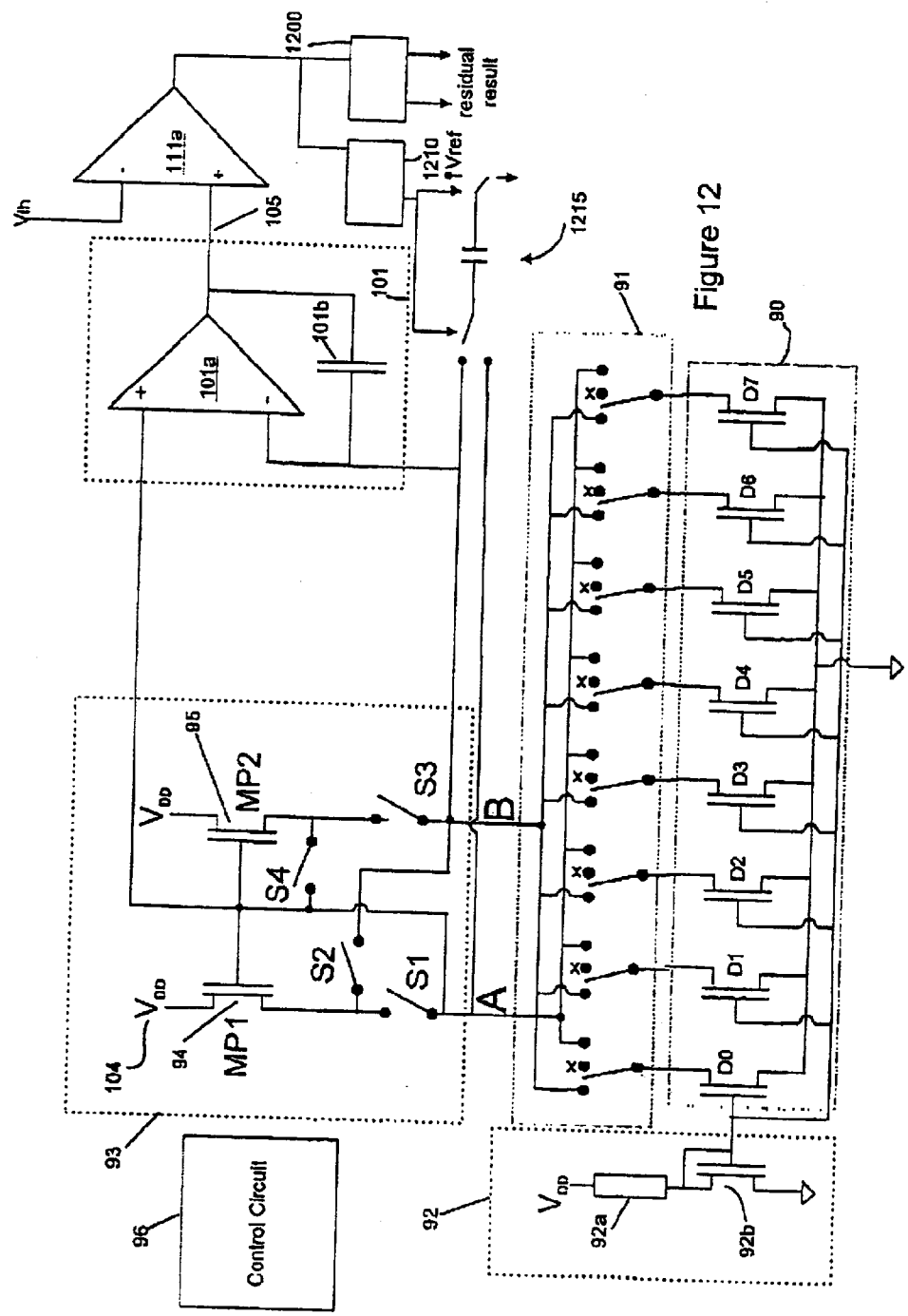
FIG. 12 is a modification to the circuit of FIG. 8 for use as a residual circuit detector.

It will further be appreciated that using a MagFET as herein before described significantly reduces the requirement for temperature compensating circuits as cancellation of offsets will occur even when the offset characteristics of the individual drains of the MagFET change with temperature (or age of the device). FIG. 12 shows an example of circuitry that can be used to implement the MagFET configuration in detecting residual current, i.e. a Residual Current Detector (RCD) or as is known in the United States a ground fault detector. Such circuitry has applications including the following:

1. To help protect plant and equipment from fires started by (usually) low fault currents passing from live to earth, that a fuse or circuit breaker might not see.
2. To prevent fatal electric shock to personnel by reducing to safe levels (not eliminating) the value and length of time a person is exposed to current flow through the body.
3. To provide an indication that an unsafe condition could exist.

The noise cancellation scheme that was described above with reference to the circuitry of FIG. 9 can be used to implement a residual current detector utilising a magnetic sensor, incorporating a MagFET, of sufficient sensitivity to meet this requirement. This, it will be appreciated will also be a device that was also compatible with standard MOS processing. As the power supply that is detected using RCD type devices is an A.C. system, any integration of residual current over the fill 50 Hz cycle will sum to zero, as the residual current in the positive half of the cycle will cancel that in the negative half of the cycle. Therefore, the residual current in the positive half cycle will have to be summed positively and that in the negative half cycle negatively in order to produce an absolute value of the residual current over the cycle.

Figure 11:
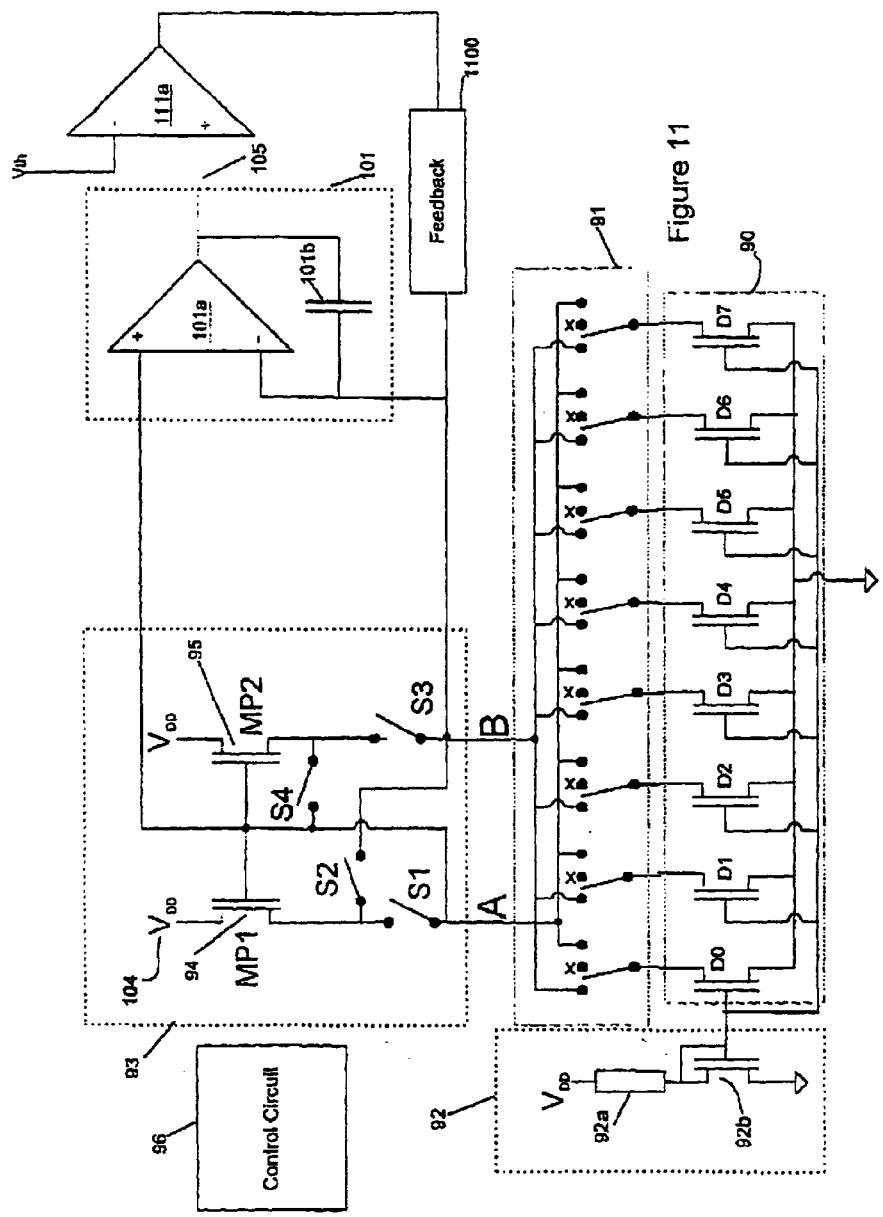
FIG. 11 is a modification to the circuit of FIG. 12 showing an example of a feedback circuit.
Figure 13:
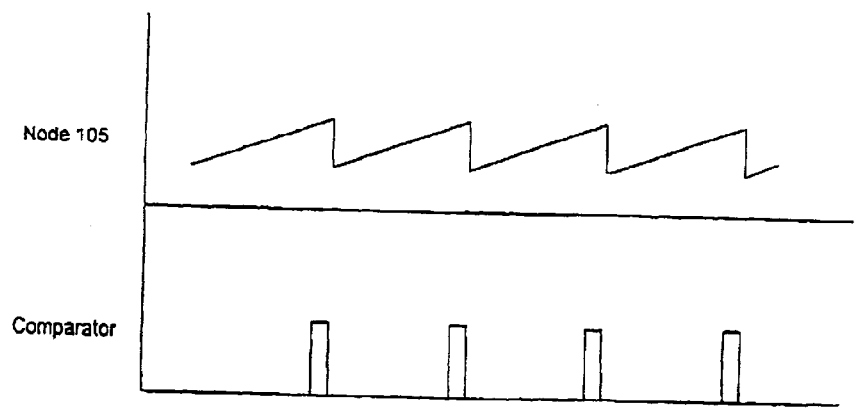
FIG. 13 is a timing diagram for the circuit of FIG. 12.

FIGS. 11 and 12 show a modification to the circuit of FIG. 9 so as to be used as a basis for such a residual current detector. The same reference numerals will be used for equivalent components. A comparator 111a is provided at the output of the integrator 105 and is adapted to provide a comparative signal between the output and a threshold or trip signal Vth. As shown in FIG. 13 as the output of the integrator 101a ramps up during each cycle, the comparator compares this to the threshold voltage. A feedback mechanism 1100 is provided at the output of the comparator and is adapted to feedback a signal to the integrator so as to maintain the output below this threshold signal. It will be appreciated that the threshold signal can be altered depending on the application.

FIG. 11 shows an implementation of the feedback mechanism 1100, according to one embodiment of the invention, which is implemented by means of switch capacitor circuit components. The output of the comparator 111a is provided to switch control logic 1210 which outputs a control signal via the switching mechanism 1215 so as to effect the feedback signal to the integrator 101a. The switching mechanism is also electrically connectable to the first input A to the measurement circuit.

By connecting the output of the integrator 105 by a feedback mechanism 1100 to the integrating capacitor 101b then the frequency of the output of the comparator 111a will give a measure of the residual current. If this frequency is counted up during one half cycle and counted down during the next, the resultant number will give a measure of the residual current over the full 50 Hz cycle. This counting is effected by providing a counter, in this embodiment an up/down counter 1200, at the output of the comparator.

It will be appreciated that this up/down count, while effecting a count of the frequency will also remove any offsets due to frequency components induced by displacement currents etc. as was the case in the part we integrated. Using the example of a device having a comparator base frequency of 200 counts per 50 Hz cycle due to the displacement currents induced by the switching action of the switches connected to D0–D7. If during the positive cycle, the magnetic field induced by the residual current increased this count to 110 counts and decreased it to 90 counts in the negative half cycle, then the up/down count for the whole cycle would be 20 and this would be a measure of the residual current. The output of the counter 1200 can be used as an input signal to control logic so as to effect a corrective action or provide an indicator that a fault is present if the counter reaches threshold values.

It will be appreciated that in this manner the invention could be used to implement a residual current detector that could use the much lower cost iron core compared to the more expensive requirement for a current sensing coil that are required in known implementations for such current sensing circuits.

The invention in its broader aspects is not limited to the specific details shown and described above. Departures may be made from such details within the scope of the accompanying claim without departing from the principles and spirit of the invention and without sacrificing its advantages.

What is claimed is:

1. A MagFET comprising:
   a gate;
   a source; and
   a first set of at least three drains wherein each of the drains of the first set have equivalent electrical characteristics, wherein the drains of the first set are arranged uniformly about the source, and where the drains of the first set are arranged in a substantially circular formation.

2. The MagFET according to claim 1, wherein the differential characteristics between adjacent drains of the first set are equivalent.

3. The MagFET according to claim 1, wherein the distance between the adjacent drains of the first set are similar.

4. The MagFET according to claim 1, in which the drains are arranged in pairs for measurement purposes, and where the MagFET comprises at least two pairs of drains.

5. The MagFET according to claim 1, further comprising a second set of drains.

6. The MagFET according to claim 5, wherein at least one drain of the second set is disposed between adjacent drains of the first set.

7. The MagFET according to claim 5, wherein each drain of the second set is larger than the drains of the first set.

8. The MagFET according to claim 5, which, in use, is designed to have a lower current flowing in the first set of drains than the second set of drains.

9. A method of measuring a magnetic field using the MagFET as recited in claim 1, comprising the steps of:

a) suitably biasing the MagFET, b) measuring the differential current between the drains of each pairing of drains; and c) combining the measured differential currents to produce a signal indicative of the strength of the magnetic field.

10. A method of measuring a magnetic field using a MagFET comprising:

a gate;

a source; and a first set of at least three drains wherein each of the drains of the first set have equivalent electrical characteristics, wherein the drains of the first set are arranged uniformly about the source, and where the drains of the first set are arranged in a substantially circular formation, the method comprising the steps of:

a) suitably biasing the MagFET, b) measuring the differential current between the drains of each pairing of drains; and combining the measured differential currents to produce a signal indicative of the strength of the magnetic field, wherein the step of combining the measured differential currents is performed as an averaging or integrating function.

11. A MagFET comprising:

a gate;

a source;

a first set of at least three drains wherein each of the drains of the first set have equivalent electrical characteristics, wherein the drains of the first set are arranged uniformly about the source, and where the drains of the first set are arranged in a substantially circular formation; and a second set of drains, wherein at least one drain of the second set is disposed between adjacent drains of the first set, and wherein each drain of the second set is larger than the drains of the first set.

* * * * *